(12) United States Patent
Yokogawa et al.

(10) Patent No.: US 8,823,026 B2
(45) Date of Patent: Sep. 2, 2014

(54) NITRIDE SEMICONDUCTOR LIGHT-EMITTING ELEMENT AND MANUFACTURING METHOD THEREFOR

(75) Inventors: Toshiya Yokogawa, Nara (JP); Junko Iwanaga, Osaka (JP); Akira Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 7 days.

(21) Appl. No.: 13/880,027

(22) PCT Filed: May 2, 2012

(86) PCT No.: PCT/JP2012/002969
§ 371 (c)(1),
(2), (4) Date: Apr. 17, 2013

(87) PCT Pub. No.: WO2012/157198
PCT Pub. Date: Nov. 22, 2012

(65) Prior Publication Data
US 2013/0214288 A1    Aug. 22, 2013

(30) Foreign Application Priority Data

May 18, 2011    (JP) .................................. 2011-111110

(51) Int. Cl.
*H01L 33/00* (2010.01)
*H01L 33/32* (2010.01)
*H01L 33/02* (2010.01)
*H01L 33/16* (2010.01)

(52) U.S. Cl.
CPC ................ *H01L 33/32* (2013.01); *H01L 33/02* (2013.01); *H01L 33/16* (2013.01)
USPC .............................................. 257/94; 438/29

(58) Field of Classification Search
CPC ...... H01L 33/0075; H01L 33/16; H01L 33/36
USPC ......................................... 257/94, 98; 438/29
See application file for complete search history.

(56) References Cited

U.S. PATENT DOCUMENTS

| 2005/0167690 | A1 | 8/2005 | Gardner et al. |
| 2009/0095973 | A1 | 4/2009 | Tanaka et al. |

(Continued)

FOREIGN PATENT DOCUMENTS

| JP | 09-186362 A | 7/1997 |
| JP | 10-079530 A | 3/1998 |

(Continued)

OTHER PUBLICATIONS

International Search Report for corresponding International Application No. PCT/JP2012/002969 mailed Jun. 12, 2012.

*Primary Examiner* — Mark Prenty
(74) *Attorney, Agent, or Firm* — Renner, Otto, Boisselle & Sklar, LLP (57) ABSTRACT

A nitride-based semiconductor light-emitting device of an embodiment includes a semiconductor multilayer structure having a growing plane which is an m-plane and being made of a GaN-based semiconductor. The semiconductor multilayer structure includes a n-type semiconductor layer, a p-type semiconductor layer, a p-side electrode provided on the p-type semiconductor layer, and an active layer interposed between the n-type semiconductor layer and the p-type semiconductor layer. The ratio of the thickness of the active layer to the thickness of the n-type semiconductor layer, D, is in the range of $1.8 \times 10^{-4} \leq D \leq 14.1 \times 10^{-4}$. The area of the p-side electrode, S, is in the range of $1 \times 10^2 \, \mu m^2 \leq S \leq 9 \times 10^4 \, \mu m^2$. A maximum current density which leads to 88% of a maximum of the external quantum efficiency is not less than $2 \, A/mm^2$.

15 Claims, 8 Drawing Sheets

(56) References Cited

U.S. PATENT DOCUMENTS

| | | |
|---|---|---|
| 2010/0230690 A1 | 9/2010 | Kyono et al. |
| 2011/0031522 A1 | 2/2011 | Oya et al. |
| 2011/0037088 A1 | 2/2011 | Oya et al. |
| 2011/0037089 A1 | 2/2011 | Oya et al. |
| 2011/0042646 A1 | 2/2011 | Ohta et al. |
| 2011/0101372 A1 | 5/2011 | Oya et al. |
| 2011/0156048 A1 | 6/2011 | Yokogawa et al. |
| 2011/0186860 A1 | 8/2011 | Enya et al. |
| 2013/0214288 A1* | 8/2013 | Yokogawa et al. ............ 257/76 |

FOREIGN PATENT DOCUMENTS

| | | |
|---|---|---|
| JP | 2000-091638 A | 3/2000 |
| JP | 2000-196146 A | 7/2000 |
| JP | 2001-308462 A | 11/2001 |
| JP | 2003-332697 A | 11/2003 |
| WO | 2010/052810 A1 | 5/2010 |
| WO | 2010/103804 A1 | 9/2010 |
| WO | 2010/113399 A1 | 10/2010 |
| WO | 2010/113405 A1 | 10/2010 |
| WO | 2010/113406 A | 10/2010 |

* cited by examiner

| PLANE ORIENTA-TION | CURRENT DENSITY | EFFICIENCY |
|---|---|---|
| C-PLANE | 10A/cm2 | 31% |
| | 300A/cm2 | 10% |
| M-PLANE | 10A/cm2 | 20% |
| | 300A/cm2 | 11% |

NITRIDE SEMICONDUCTOR LIGHT-EMITTING ELEMENT AND MANUFACTURING METHOD THEREFOR

TECHNICAL FIELD

The present invention relates to a nitride-based semiconductor light-emitting device and a method for manufacturing the same.

BACKGROUND ART

Figure 1:
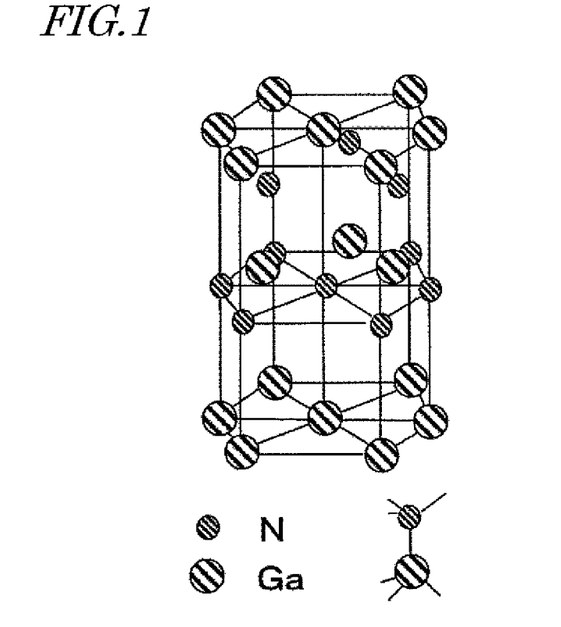
FIG. 1 is a perspective view schematically illustrating a unit cell of GaN.

A nitride semiconductor including nitrogen (N) as a Group V element is a prime candidate for a material to make a short-wave light-emitting device because of its wide bandgap. Among other things, gallium nitride-based compound semiconductors (GaN-based semiconductors) have been researched and developed particularly extensively. As a result, blue light-emitting diodes (LEDs), green LEDs, and semiconductor laser diodes made of GaN-based semiconductors have already been used in actual products (see, for example, Patent Documents 1 and 2). A GaN-based semiconductor has a wurtzite crystal structure. FIG. 1 schematically illustrates a unit cell of GaN. In an $Al_xGa_yIn_zN$ ($0 \leq x, y, z \leq 1$, $x+y+z=1$) semiconductor crystal, some of the Ga atoms shown in FIG. 1 may be replaced with Al and/or In atoms.

Figure 2:
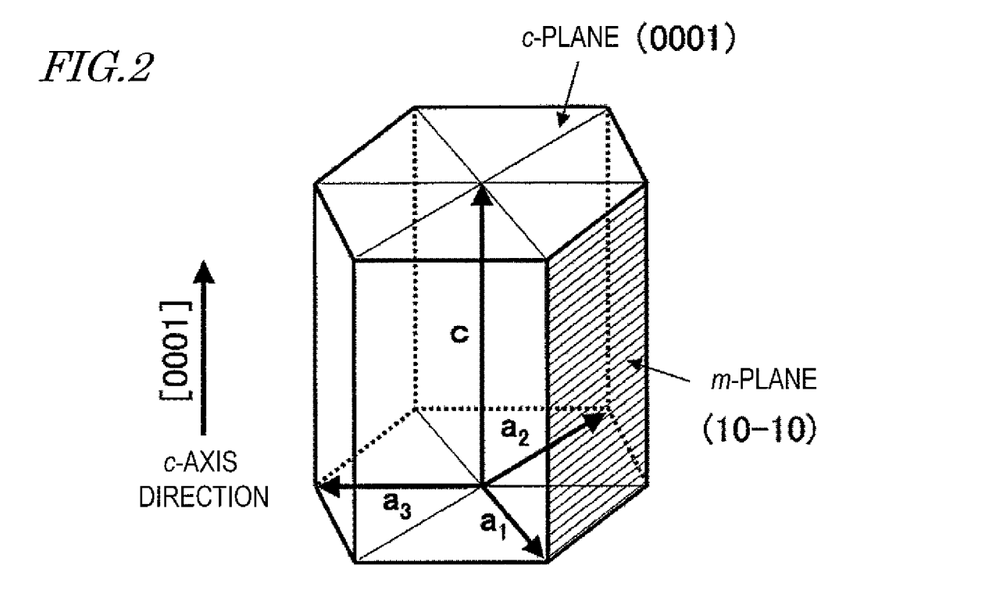
FIG. 2 is a perspective view showing primitive vectors a1, a2, a3, and c representing a wurtzite crystal structure.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated along the c-axis direction in the InGaN quantum well in the active layer. Once such a piezoelectric field has been generated in the active layer, some positional deviation occurs in the distributions of electrons and holes in the active layer due to the quantum confinement Stark effect of carriers. Consequently, the internal quantum efficiency (IQE) decreases. Thus, in the case of a semiconductor laser diode, the threshold current increases. In the case of an LED, the power consumption increases, and the luminous efficacy decreases. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10–10) plane that is perpendicular to the [10–10] direction and that is called an "m-plane" be used. As used herein, "-" attached on the left-hand side of a Miller-Bravais index in the parentheses means a "bar" (a negative direction index). As shown in FIG. 2, the m-plane is parallel to the c-axis (primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above.

The "m-plane" is a generic term that collectively refers to a family of planes including (10–10), (–1010), (1–100), (–1100), (01–10) and (0–110) planes. As used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

Patent Documents 1 to 5 disclose a nitride-based semiconductor device which includes a multilayer structure of m-plane semiconductor layers.

CITATION LIST

Patent Literature

Patent Document 1: WO 2010/113405
Patent Document 2: WO 2010/113406
Patent Document 3: WO 2010/113399
Patent Document 4: WO 2010/103804
Patent Document 5: WO 2010/052810

SUMMARY OF INVENTION

Technical Problem

However, even in the case of m-plane, further improvement of the luminous efficiency has been demanded. An embodiment of the present invention provides a nitride-based semiconductor light-emitting device of high luminous efficiency and a manufacturing method of the nitride-based semiconductor light-emitting device.

Solution to Problem

According to one aspect of the present invention, a nitride-based semiconductor light-emitting device includes a semiconductor multilayer structure having a growing plane which is an m-plane and being made of a GaN-based semiconductor, wherein the semiconductor multilayer structure includes a n-type semiconductor layer, a p-type semiconductor layer, a p-side electrode provided on the p-type semiconductor layer, and an active layer interposed between the n-type semiconductor layer and the p-type semiconductor layer, a ratio of a thickness of the active layer to a thickness of the n-type semiconductor layer, D, is in the range of $1.8 \times 10^{-4} \leq D \leq 14.1 \times 10^{-4}$, an area of the p-side electrode, S, is in the range of $1 \times 10^2 \ \mu m^2 \leq S \leq 9 \times 10^4 \ \mu m^2$, and a maximum current density which leads to 88% of a maximum of the external quantum efficiency is not less than $2 \ A/mm^2$.

According to one aspect of the present invention, a light source includes: any of the above-described nitride-based semiconductor light-emitting devices; and a wavelength converting section including a phosphor that converts a wavelength of light emitted from the nitride-based semiconductor light-emitting device.

According to one aspect of the present invention, a method for manufacturing a nitride-based semiconductor light-emitting device includes the steps of: (a) forming a semiconductor multilayer structure having a growing plane which is an m-plane and being made of a GaN-based semiconductor; and (b) forming a p-side electrode on the semiconductor multilayer structure, wherein the step (a) includes (a1) forming a n-type semiconductor layer, (a2) after the step (a1), an active layer formation step for forming an active layer, and (a3) after the step (a2), forming a p-type semiconductor layer, in the step (a1) and the step (a2), the n-type semiconductor layer and the active layer are formed such that a maximum current density which leads to 88% of a maximum of the external quantum efficiency is not less than 2 A/mm², in the step (a2), the active layer is formed such that a ratio of a thickness of the active layer to a final thickness of the n-type semiconductor layer, D, is in the range of $1.8 \times 10^{-4} \leq D\ 14.1 \times 10^{-4}$, and in the step (b), the p-side electrode is formed such that an area of the p-side electrode, S, is in the range of $1 \times 10^2\ \mu m^2 \leq S \leq 9 \times 10^4\ \mu m^2$.

Advantageous Effects of Invention

According to an embodiment of the present invention, the luminous efficiency of a nitride-based semiconductor light-emitting device of which growing plane is an m-plane can be improved.

DESCRIPTION OF EMBODIMENTS

In general, in a c-plane LED, when the electric current is increased in order to obtain a large output, an overflow of injected carriers from the active layer occurs, leading to deterioration of the luminous efficiency. This overflow can be prevented by increasing the thickness of the active layer so as to reduce the carrier density of the active layer. This is because, if the electric current injected into the active layer is constant, the number of carriers contained in unit volume inside the active layer decreases as the volume of the active layer increases, and as a result, the overflow is prevented. However, in the case of the c-plane LED, even when the thickness of the active layer is increased, the luminous efficiency decreases against all expectations because of the presence of a piezoelectric field.

Thus, in the conventional c-plane LED, the chip area is increased instead of increasing the thickness of the active layer, whereby the carrier density in the active layer is reduced. Since the chip area corresponds to the area of the active layer, the volume of the active layer can be increased by increasing the chip area. When a GaN-based substrate is employed, the chip area is usually set to 1 mm² or more. On the other hand, in the case of an m-plane LED, a piezoelectric field would not be produced in the active layer. Therefore, even when the thickness of the active layer is increased, the luminous efficiency would not decrease. Thus, in the m-plane LED, the thickness of the active layer is increased instead of increasing the chip area, whereby the volume of the active layer is increased, and accordingly, the carrier density in the active layer can be reduced. And, as a result, even when the electric current is increased, the overflow of carriers can be reduced, and the decrease of the luminous efficiency can be prevented.

However, the inventors discovered a new problem in the m-plane LED. The problem is that the m-plane semiconductor is readily contaminated with oxygen, and there are many non-radiative centers in the active layer. As the injected carrier density decreases, the effects of the non-radiative centers become stronger. Therefore, it was discovered that, in the case of a low current density, the injected carrier density is low, and the luminous efficiency decreases due to the effects of the non-radiative centers. This tendency is strong particularly in a structure in which both the p-side electrode and the n-side electrode are provided on the same growing plane side, such as a flip chip structure. Further, when the volume of the active layer is increased by increasing the thickness of the active layer, the injected carrier density further decreases. Therefore, the luminous efficiency of the m-plane LED further decreases in the low current range.

In practical uses, ideally, high luminous efficiency is desired in any electric current range within the entire range ranging from the low current range to the high current range. Therefore, there is a large problem that the luminous efficiency decreases in the low current range.

Under such circumstances, the inventors of the present application conducted researches for the purpose of solving the problem of the decrease in luminous efficiency in a GaN-based semiconductor device grown on the m-plane that is a non-polar plane and discovered a configuration which realizes high efficiency in any electric current range within the entire range ranging from the low current range to the high current range.

According to one aspect of the present invention, a nitride-based semiconductor light-emitting device includes a semiconductor multilayer structure having a growing plane which is an m-plane and being made of a GaN-based semiconductor, wherein the semiconductor multilayer structure includes a n-type semiconductor layer, a p-type semiconductor layer, a p-side electrode provided on the p-type semiconductor layer, and an active layer interposed between the n-type semiconductor layer and the p-type semiconductor layer, a ratio of a thickness of the active layer to a thickness of the n-type semiconductor layer, D, is in the range of $1.8\times10^{-4} \leq D \leq 14.1\times10^{-4}$, an area of the p-side electrode, S, is in the range of $1\times10^2$ $\mu m^2 \leq S \leq 9\times10^4$ $\mu m^2$, and a maximum current density which leads to 88% of a maximum of the external quantum efficiency is not less than 2 A/mm².

In one embodiment, the ratio of the thickness of the active layer to the thickness of the n-type semiconductor layer, D, is in the range of $2.62\times10^{-4} \leq D\ 8.49\times10^{-4}$.

In one embodiment, the area of the p-side electrode, S, is in the range of $1\times10^2$ $\mu m^2 \leq S \leq 4\times10^4$ $\mu m^2$.

In one embodiment, the active layer has an oxygen concentration of not less than $2\times10^{17}$ cm⁻³.

In one embodiment, the thickness of the active layer is not less than 0.027 μm and not more than 0.045 μm.

In one embodiment, the n-type semiconductor layer includes a substrate which is made of a n-type semiconductor.

In one embodiment, the semiconductor multilayer structure is made of an $Al_xGa_yIn_zN$ (x+y+z=1, x≥0, y≥0, z≥0) semiconductor.

According to one aspect of the present invention, a light source includes: any of the above-described nitride-based semiconductor light-emitting devices; and a wavelength converting section including a phosphor that converts a wavelength of light emitted from the nitride-based semiconductor light-emitting device.

According to one aspect of the present invention, a method for manufacturing a nitride-based semiconductor light-emitting device includes the steps of: (a) forming a semiconductor multilayer structure having a growing plane which is an m-plane and being made of a GaN-based semiconductor; and (b) forming a p-side electrode on the semiconductor multilayer structure, wherein the step (a) includes (a1) forming a n-type semiconductor layer, (a2) after the step (a1), an active layer formation step for forming an active layer, and (a3) after the step (a2), forming a p-type semiconductor layer, in the step (a1) and the step (a2), the n-type semiconductor layer and the active layer are formed such that a maximum current density which leads to 88% of a maximum of the external quantum efficiency is not less than 2 A/mm², in the step (a2), the active layer is formed such that a ratio of a thickness of the active layer to a final thickness of the n-type semiconductor layer, D, is in the range of $1.8\times10^{-4} \leq D \leq 14.1\times10^{-4}$, and in the step (b), the p-side electrode is formed such that an area of the p-side electrode, S, is in the range of $1\times10^2$ $\mu m^2 \leq S \leq 9\times10^4$ $\mu m^2$.

In one embodiment, in the step (a2), the active layer is formed such that the ratio of the thickness of the active layer to the final thickness of the n-type semiconductor layer, D, is in the range of $2.62\times10^{-4} \leq D \leq 8.49\times10^{-4}$.

In one embodiment, in the step (b), the p-side electrode is formed such that the area of the p-side electrode, S, is in the range of $1\times10^2$ $m^2 \leq S \leq 4\times10^4$ $\mu m^2$.

In one embodiment, the active layer has an oxygen concentration of not less than $2\times10^{17}$ cm⁻³.

In one embodiment, the thickness of the active layer is not less than 0.027 μm and not more than 0.045 μm.

In one embodiment, the n-type semiconductor layer includes a substrate which is made of a n-type semiconductor.

In one embodiment, the semiconductor multilayer structure is made of an $Al_xGa_yIn_zN$ (x+y+z=1, x≥0, y≥0, z≥0) semiconductor.

Hereinafter, an embodiment of the present invention will be described with reference to the drawings. In the drawings, any elements shown in multiple drawings and having substantially the same function will be identified by the same reference numeral for the sake of simplicity. It should be noted, however, that the present invention is not limited to the embodiment that will be described below.

FIG. 3(a) schematically illustrates the cross-sectional structure of a nitride-based semiconductor light-emitting device 100 according to an embodiment of the present invention. The nitride-based semiconductor light-emitting device 100 illustrated in FIG. 3(a) is a semiconductor device including a semiconductor multilayer structure 20 made of a gallium nitride-based compound semiconductor (GaN-based semiconductor).

The nitride-based semiconductor light-emitting device 100 of the present embodiment includes a semiconductor multilayer structure 20, which includes a GaN-based substrate of which front surface (principal surface) 12 is an m-plane and a plurality of semiconductor layers stacked on the GaN-based substrate 10. The nitride-based semiconductor light-emitting device 100 further includes a p-side electrode and a n-side electrode 40 which are provided on the semiconductor multilayer structure 20. In this example, the semiconductor multilayer structure 20 is formed by the GaN-based substrate 10 and the plurality of semiconductor layers stacked on the GaN-based substrate 10. Note that, instead of the GaN-based substrate 10, a substrate made of a non-semiconductor material (e.g., insulating material) may be used. In such a case, the semiconductor multilayer structure does not include the substrate but is formed by the semiconductor layers stacked on the substrate.

The GaN-based substrate 10 has the characteristics of the n-type semiconductor. For example, the thickness of the GaN-based substrate 10 may be 25 μm to 450 μm. More specifically, the thickness of the GaN-based substrate 10 may be 50 μm to 100 μm. It was discovered that, if the thickness of the GaN-based substrate 10 is not less than 50 μm, decrease of the efficiency in the case of a high driving current is prevented. This point will be described later. If the thickness of the GaN-based substrate 10 is not more than 100 μm, cutting is easily carried out in the process of separating LEDs into chips, and therefore, the separation yield improves.

The semiconductor multilayer structure 20 is made of a GaN-based semiconductor. More specifically, part of the semiconductor multilayer structure 20 of the present embodiment excluding the substrate 10 is made of $Al_xGa_yIn_zN$ (0≤x, y, z≤1, x+y+z=1), and the composition ratios x, y, and z vary stepwise or continuously along the normal line direction of the principal surface 12 of the substrate 10. The part of the semiconductor multilayer structure 20 excluding the substrate 10 is an m-plane semiconductor multilayer structure formed by m-plane growth. The growing plane of the m-plane semiconductor multilayer structure is an m-plane. It should be noted, however, that a-plane GaN could grow on an r-plane sapphire substrate in some instances. That is why according to the growth conditions, the principal surface of the GaN-based substrate 10 does not always have to be an m-plane. In the configuration of the present embodiment, at least the growing plane of a p-type semiconductor region of the semiconductor multilayer structure 20 which is in contact with the p-side electrode needs to be an m-plane.

The nitride-based semiconductor light-emitting device 100 of the present embodiment includes the GaN substrate 10 to support the stacked semiconductor layers. However, the device 100 may have any other substrate instead of the GaN substrate 10 and could also be used without the substrate.

FIG. 3(b) schematically illustrates the crystal structure of a nitride-based semiconductor, of which the growing plane is an m-plane, as viewed on a cross section thereof that intersects with the principal surface of the substrate at right angles.

Since Ga atoms and nitrogen atoms are present on the same atomic-plane that is parallel to the m-plane, no electrical polarization will be produced perpendicularly to the m-plane. That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as "m-plane GaN-based substrate". To obtain an m-plane nitride-based semiconductor multilayer structure that has grown perpendicularly to the m-plane, typically such an m-plane GaN substrate may be used and semiconductors may be grown on the m-plane of that substrate. This is because the crystallographic-plane orientation of the semiconductor multilayer structure should be identical with that of the principal surface of the GaN-based substrate. However, the principal surface of the substrate does not always have to be an m-plane as described above, and the device as a final product could already have its substrate removed.

The crystal structure of a nitride-based semiconductor, of which the growing plane is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga atom layer and a nitrogen atom layer that extend parallel to the c-plane are slightly misaligned from each other in the c-axis direction, and therefore, electrical polarization will be produced in the c-axis direction.

Refer to FIG. 3(a) again.

The semiconductor multilayer structure 20 includes a first conductivity type semiconductor layer, an active layer, and a second conductivity type semiconductor layer, each of which is made of a GaN-based semiconductor. For example, the first conductivity type semiconductor layer is a n-type semiconductor layer, and the second conductivity type semiconductor layer is a p-type semiconductor layer. The thickness of the p-type semiconductor layer may be 0.05 µm to 2 µm. More specifically, the thickness of the p-type semiconductor layer may be 0.1 µm to 0.3 µm. When the thickness of the p-type semiconductor layer is not less than 0.1 µm, the efficiency of injection of holes and carriers into the active layer can be sufficiently improved. When the thickness of the p-type semiconductor layer is not more than 0.3 µm, the influence of absorption of light by the p-type Mg impurity can be decreased. Also, the thickness of the n-type semiconductor layer may be 0.5 µm to 5 µm. More specifically, the thickness of the n-type semiconductor layer may be 1 µm to 3 µm. When the thickness of the n-type semiconductor layer is not less than 1 µm, the influence of defects produced at the interface with the substrate 10 and impurities can be reduced. When the thickness of the n-type semiconductor layer is not more than 3 µm, the throughput of the epitaxial growth can be improved, and the manufacturing cost can be reduced. Note that, when the substrate 10 is made of a n-type semiconductor, the "n-type semiconductor layer" included in the semiconductor multilayer structure 20 includes the substrate 10 made of a n-type semiconductor. In this case, the thickness of the "n-type semiconductor layer" included in the semiconductor multilayer structure 20 has the total value of the above-described thickness of 0.5 µm to 5 µm or 1 µm to 3 µm and the thickness of the substrate 10.

The thickness of the active layer may be 0.01 µm to 0.1 µm. When the quantum well structure of the active layer includes a single well layer (e.g., InGaN layer), the "thickness of the active layer" refers to the thickness of that well layer. When the quantum well structure of the active layer includes two or more well layers, the "thickness of the active layer" refers to the total thickness in which the thicknesses of the respective well layers are added together. The thickness of an active layer 24 may be 0.027 µm to 0.045 µm. When the thickness of the active layer 24 is in this range, the overflow of carriers of electrons is reduced while the carriers in the active layer are prevented from resulting in a non-uniform distribution.

The area of the p-side electrode is not less than $1 \times 10^2$ µm$^2$ and not more than $9 \times 10^4$ µm$^2$. The area of the p-side electrode may be not less than $4 \times 10^2$ m$^2$ and not more than $4 \times 10^4$ µm$^2$. When the area of the p-side electrode is in this range, an electric current of high density can be uniformly injected into the active layer. The reasons for this will be described later.

The semiconductor multilayer structure 20 includes, for example, a n-$Al_uGa_vIn_wN$ layer (u+v+w=1, u≥0, v≥0, w≥0) 22 which is a n-type GaN-based semiconductor layer, an active layer 24 which includes a $Al_aIn_bGa_cN$ layer (a+b+c=1, a≥0, b≥0, c≥0), and a p-$Al_dGa_eN$ layer (d+e=1, d≥0, e≥0) 25 which is a p-type GaN-based semiconductor layer as shown in FIG. 3(a). The active layer 24 is an electron injection region of the nitride-based semiconductor light-emitting device 100. The active layer 24 may have a GaInN/GaN multi-quantum well (MQW) structure in which, for example, three cycles of $Ga_{0.9}In_{0.1}N$ well layers (e.g., the total thickness of the three cycles is 15 nm) and GaN barrier layers (e.g., the total thickness of the two layers is 30 nm) are alternately stacked one upon the other.

Between the active layer 24 and the p-$Al_dGa_eN$ layer 25, an undoped GaN layer may be provided. The thickness of the undoped GaN layer is, for example, 0.005 µm to 0.05 µm. When the thickness of the undoped GaN layer is not less than 0.005 µm, diffusion of Mg to the active layer can be prevented. When the thickness of the undoped GaN layer is not more than 0.05 µm, accumulation of carriers of electrons at the interface between the undoped GaN layer and the p-$Al_dGa_eN$ layer 25 can be prevented. Between the active layer 24 and the substrate 10, a n-$Al_uGa_vIn_wN$ layer 22 which is a n-type GaN-based semiconductor layer is provided. The semiconductor multilayer structure 20 may include any other layer than the aforementioned layers.

In the p-$Al_dGa_eN$ layer 25, the composition ratio d of Al does not have to be uniform in the thickness direction. In the $Al_dGa_eN$ layer 25, the composition ratio d of Al may vary continuously or stepwise in the thickness direction. In other words, the p-$Al_dGa_eN$ layer 25 may have a multilayer structure in which a plurality of layers having different Al composition ratio d are stacked one upon the other, or may have its dopant concentration varied in the thickness direction.

The p-$Al_dGa_eN$ layer 25 includes a p-$Al_dGa_eN$ contact layer 26 on its growing plane side. The thickness of the p-$Al_dGa_eN$ contact layer 26 is, for example, not less than 10 nm and not more than 500 nm. The thickness of a portion of the p-$Al_dGa_eN$ layer 25 excluding the p-$Al_dGa_eN$ contact layer 26, i.e., the thickness of a region 27, is not less than 10 nm and not more than 500 nm, for example. The Mg concentration of this region 27 is, for example, not less than $1 \times 10^{18}$ cm$^3$ and not more than $1\times10^{19}$ cm$^{-3}$. The p-Al$_d$Ga$_e$N contact layer 26 has a higher Mg concentration than the other portion of the p-Al$_d$Ga$_e$N layer 25 excluding the p-Al$_d$Ga$_e$N contact layer 26, i.e., the region 27. The Mg concentration of the p-Al$_d$Ga$_e$N contact layer 26 is, specifically, not less than $4\times10^{19}$ cm$^3$ and not more than $2\times10^{20}$ cm$^{-3}$ and, more specifically, may be not more than $1\times10^{20}$ cm$^{-3}$.

The p-side electrode 30 of the present embodiment includes, for example, an Ag layer. The Ag layer of the p-side electrode 30 is in contact with the p-type semiconductor layer of the semiconductor multilayer structure 20, specifically with the p-Al$_d$Ga$_e$N contact layer 26, and functions as the p-side electrode 30.

Figure 4:
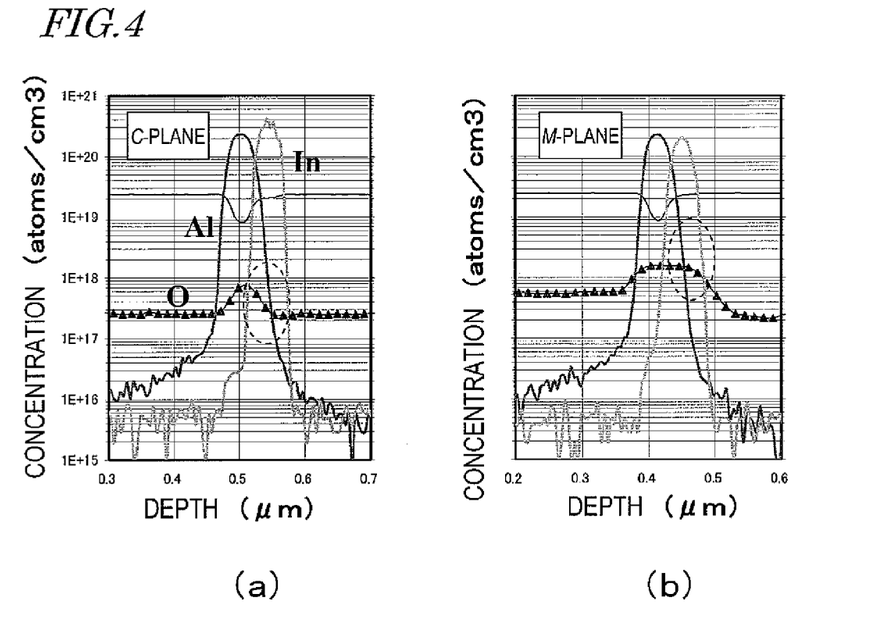
FIGS. 4(a) and 4(b) are graphs showing the profiles of oxygen, Al, and In along the depth direction in conventional c-plane and m-plane nitride-based semiconductor light-emitting devices using SIMS analysis.

FIGS. 4(a) and 4(b) show the profiles of oxygen, Al, and In along the depth direction in c-plane and m-plane nitride-based semiconductor light-emitting devices, respectively, using SIMS analysis. A layer containing In corresponds to the region of the InGaN active layer. It can be seen that the oxygen content concentration of the InGaN active layer is higher in the m-plane nitride-based semiconductor light-emitting device than in the c-plane nitride-based semiconductor light-emitting device. In the example of FIG. 4, the oxygen content concentration of the active layer of the m-plane nitride-based semiconductor light-emitting device is about 10 times the oxygen content concentration of the active layer of the c-plane nitride-based semiconductor light-emitting device. This means that the m-plane InGaN crystal is more likely to be contaminated with oxygen. This is the problem with the m-plane nitride-based semiconductor light-emitting device.

The reasons for the above will be described below.

Figure 5:
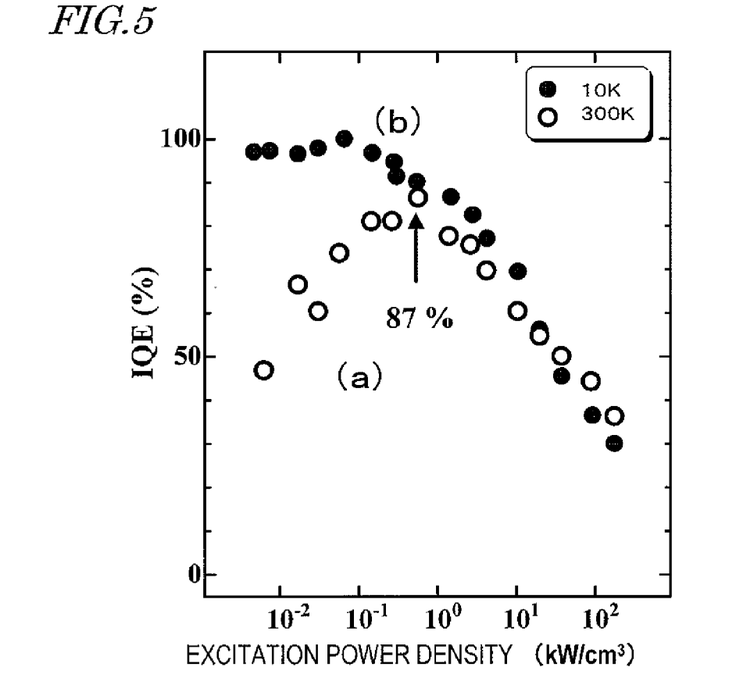
FIG. 5 is a graph showing the excitation light density dependence of the internal quantum efficiency (IQE).

FIG. 5 shows the relationship between the internal quantum efficiency (IQE) and the excitation power density in the case where the m-plane nitride-based semiconductor light-emitting device was photoexcited. This relationship was obtained by measurement. The horizontal axis represents the excitation power density. The vertical axis represents the IQE. The data point group (a) and the data point group (b) shown in FIG. 5 indicate the relationships between the IQE and the excitation power density at the room temperature (RT) and the low temperature (LT: 10 K), respectively. At the low temperature, decrease of the IQE is not seen even in the case of low excitation power densities. This is because the diffusion length of carriers that are excited to be injected into the active layer is short at the low temperature so that the carriers cannot be trapped even in the presence of non-radiative centers, and thus, almost all of the carriers contribute to emission. At the room temperature, decrease of the IQE is seen in the case of low excitation power densities. This is probably attributed to the fact that non-radiative centers which are produced due to aforementioned oxygen contamination are present in the active layer, and the injected carriers are consumed by the non-radiative centers. That is, the m-plane nitride-based semiconductor light-emitting device contains a larger number of non-radiative centers than the c-plane nitride-based semiconductor light-emitting device, and therefore, the IQE decreases when the injected carrier density is low (for example, when the excitation power density is not more than 1 kW/cm$^2$). On the other hand, as the excitation power density is increased from 0.01 kW/cm$^2$ to 0.1 kW/cm$^2$ and then to 1 kW/cm$^2$, the IQE increases. This is because the non-radiative centers are filled with the injected carriers and deactivated. As described hereinabove, the present inventors discovered a problem specific to the m-plane that the m-plane nitride-based semiconductor light-emitting device is contaminated with oxygen at a high concentration, and therefore, the efficiency is low in the low current density region.

In the present embodiment, for example, the oxygen concentration of the active layer is not less than $2\times10^{17}$ cm$^{-3}$ and not more than $8\times10^{17}$ cm$^{-3}$. More specifically, the oxygen concentration of the active layer may be not less than $1\times10^{17}$ cm$^{-3}$ and not more than $5\times10^{17}$ cm$^{-3}$.

Figure 6:
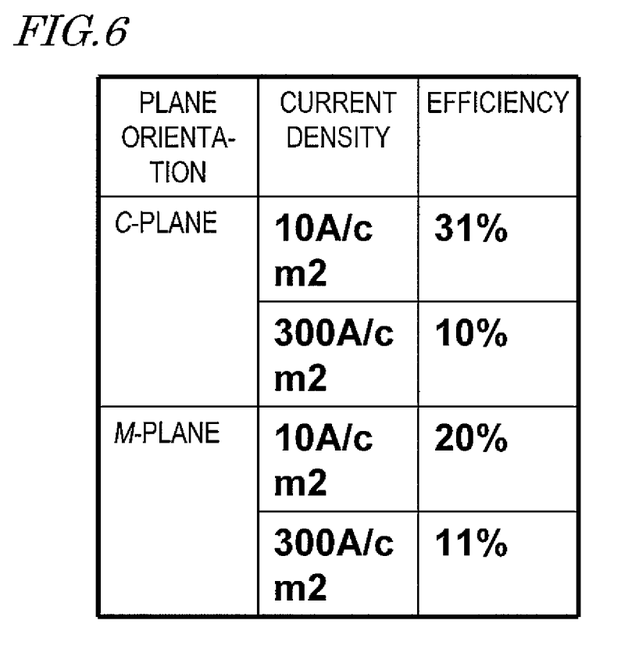
FIG. 6 is a graph showing the external quantum efficiency (EQE) in conventional c-plane and m-plane LED structures.

FIG. 6 shows the comparison of the external quantum efficiency (EQE) in the conventional c-plane and m-plane nitride-based semiconductor light-emitting devices. As in the case of the above-described photoexcitation, the influence of oxygen contamination was also examined in the case of current injection into the nitride-based semiconductor light-emitting devices. It was confirmed that, in the m-plane nitride-based semiconductor light-emitting device, the external quantum efficiency was low in the low current range as compared with the c-plane nitride-based semiconductor light-emitting device. It is considered that this is also a phenomenon which was attributed to the non-radiative centers that were produced due to oxygen as in the case of photoexcitation. Specifically, when comparing c-plane and m-plane nitride-based semiconductor light-emitting devices which achieve generally equal external quantum efficiencies with a large current density of 300 A/cm$^2$, the c-plane nitride-based semiconductor light-emitting device achieves a high external quantum efficiency with a low current density of 10 A/cm$^2$, whereas the m-plane nitride-based semiconductor light-emitting device achieves a low external quantum efficiency with a low current density due to oxygen that constitutes the non-radiative centers.

In view of the above circumstances, the inventors discovered an appropriate area of the p-side electrode (this determines the area of the growing plane of the active layer and the chip area) and an appropriate ratio between the thickness of the n-type GaN-based semiconductor layer and the thickness of the active layer, which are suitable for the m-plane nitride-based semiconductor light-emitting device, and solved the above-described problem. Hereinafter, the area of the growing plane of the semiconductor multilayer structure of the m-plane nitride-based semiconductor light-emitting device is sometimes referred to as "chip area", and the length of one side is sometimes referred to as "chip length".

Hereinafter, an example where the p-side electrode has a "square" shape is described. Thus, in the following description, the relationship of (the length of the p-side electrode)× (the length of the p-side electrode)=(the area of the p-side electrode) holds true. The present invention is not limited to the case where the p-side electrode has a "square" shape. When the shape of the p-side electrode is not "square", the square root of "the area of the p-side electrode" is equivalent to "the length of the p-side electrode" in this specification. Note that the area of a portion in which the n-side electrode is provided and the area of a portion of the growing plane of the semiconductor multilayer structure in which the electrode is not provided are very small, and the p-side electrode area is approximately equal to the chip area. For example, the chip area is more than 1 time the p-side electrode area and not more than 1.1 time the p-side electrode area. The contact resistance of the n-side electrode is lower than the contact resistance of the p-side electrode. Generally, the contact resistance of the n-side electrode is not more than ⅒ of the contact resistance of the p-side electrode, and therefore, the area of the n-side electrode may be not more than ⅒ of the area of the p-side electrode. The description provided below is on the assumption that the growing plane of the semiconductor multilayer structure has a "square" shape, and the relationship of "the chip area=the p-side electrode area" and the relationship of "the chip length=the p-side electrode length" hold true.

Figure 7:
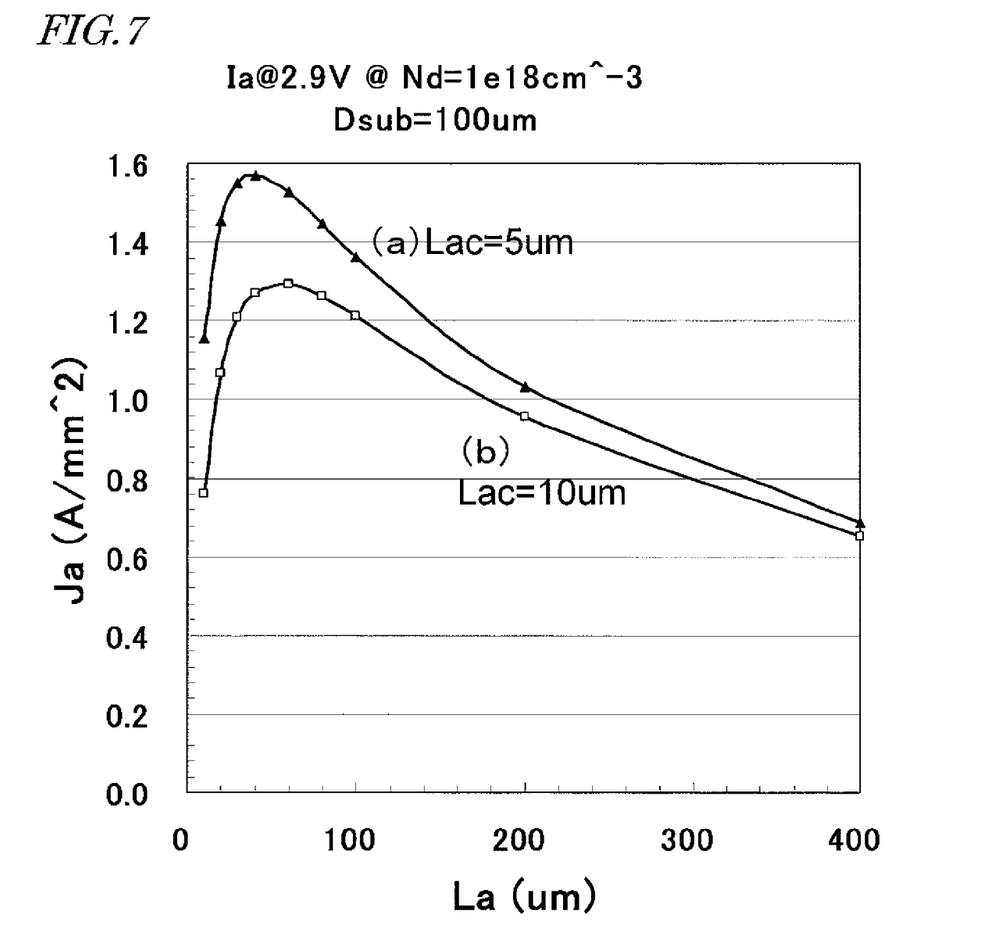
FIG. 7 is a graph showing the chip size dependence of the injected current density.

FIG. 7 shows the relationship between the injected current density and the area of the p-side electrode in the m-plane nitride-based semiconductor light-emitting device which has the configuration shown in FIG. 3(a). This relationship was obtained by simulation. In the graph of FIG. 7, the horizontal axis represents the length of one side of the p-side electrode 30 (square), La, and the vertical axis represents the density of the current injected into the active layer, Ja. The injected current density Ja refers to a value which is obtained when a bias voltage of 2.9 V is applied between the electrodes.

Curve (a) and Curve (b) of FIG. 7 represent the simulation results for cases where the distance between-side electrodes which were obtained by projecting the n-side electrode and the p-side electrode onto the growing plane of the semiconductor multilayer structure, Lac, is 5 µm and 10 µm.

In the configuration used in the simulation, the thickness of the n-type GaN-based semiconductor layer 22 is 3 µm. The substrate 10 has a n-type carrier concentration of $1\times10^{18}$ cm$^{-3}$ and a thickness of 100 µm. Therefore, the thickness of the n-type GaN-based semiconductor region that is formed by the substrate 10 and the n-type GaN-based semiconductor layer 22 is 103 µm. On the other hand, the thickness of the p-type semiconductor region, i.e., the thickness of the p-Al$_d$Ga$_e$N layer 25 that includes the p-Al$_d$Ga$_e$N contact layer 26, is 100 nm. The active layer is formed by a multi-quantum well including three cycles of InGaN well layers (total thickness: 15 nm=5 nm×3) and two GaN barrier layers (total thickness: 30 nm=15 nm×2). The total thickness of the active layer is 45 nm.

As seen from FIG. 7, when the length of the p-side electrode 30, La, is shorter than 300 µm, the density of the current injected into the active layer starts to greatly increase. In an m-plane nitride-based semiconductor light-emitting device which is contaminated with oxygen at not less than $2\times10^{17}$ cm$^{-3}$ and not more than $8\times10^{17}$ cm$^{-3}$, the carriers which are necessary for filling all of the non-radiative centers which correspond to that oxygen concentration are obtained when the injected current density Ja is not less than 0.8 A/mm$^2$ according to the simulation. This level of the injected current density Ja can be achieved when the p-side electrode 30 is smaller than 300 µm, as seen from FIG. 7. Further, the injected current density Ja sharply increases when the length of the p-side electrode 30, La, is shorter than 200 µm. When the length of the p-side electrode 30, La, is shorter than 100 µm, the increase rate starts to decrease and reaches a peak at 50 µm. When the length La is still shorter, the injected current density Ja decreases.

As seen from the above, when the length of the p-side electrode 30 of the m-plane nitride-based semiconductor light-emitting device (chip length) is not less than 10 µm and not more than 300 µm, a high injected current density is obtained. When the chip length is not less than 10 µm and not more than 200 µm, a higher injected current density is obtained. When the chip length is not less than 20 µm and not more than 100 µm, a still higher injected current density is obtained. Thus, even when the active layer is contaminated with oxygen, non-radiative centers which are attributed to oxygen can be filled with high injection carriers by reducing the chip size, and therefore, high efficiency can be achieved even in the case of a low electric current.

The area of the p-side electrode 30 is obtained by squaring the length of the p-side electrode 30. Specifically, the area of the p-side electrode 30 of the present embodiment may be not less than 100 µm$^2$ and not more than 90000 µm$^2$. More specifically, the area of the p-side electrode 30 of the present embodiment may be not less than 100 µm$^2$ and not more than 40000 µm$^2$. Still more specifically, the area of the p-side electrode 30 of the present embodiment may be not less than 400 µm$^2$ and not more than 10000 µm$^2$. When considering the yield of the chip separation process and the handling easiness, the area of the p-side electrode 30 may be not less than 2500 µm$^2$ and not more than 90000 µm$^2$.

According to an embodiment of the present invention, when the area of the p-side electrode 30 is not less than 100 µm$^2$ and not more than 90000 µm$^2$, the injected current density of the active layer can be improved, the decrease in efficiency due to oxygen can be prevented, and a high efficiency can be achieved at least with a low current density.

In FIG. 7, the vertical axis Ja represents the current density, which was obtained by dividing the value of an electric current which flows when the voltage was biased at 2.9 V by the area of the p-side electrode 30. Ja shown in FIG. 7 is uniquely determined when the lengths of sides of the p-side electrode in a direction away from the n-side electrode, La and Lac, are given, and does not depend on the length of the depth of the p-side electrode 30 shown in FIG. 3 (the length of one side of the p-side electrode extending parallel to one side of the n-side electrode). In general, the shape of the p-side electrode 30 is square in many cases, although it is not limited to a square shape. For example, the shape of the p-side electrode 30 may be rectangular. The current value is obtained by multiplying Ja, which is determined by the lengths of sides of the p-side electrode in a direction away from the n-side electrode, La and Lac, by the area of the p-side electrode 30 (the length of the depth of the p-side electrode 30×La). Therefore, the optimum value of the area does not depend on the shape of the electrode. In an example which will be described below, Lac is 5 µm, although the same effects can be achieved when Lac is not less than 5 µm and not more than 10 µm. In the case where the value of Ja which is obtained when the voltage is biased at 2.9 V is not less than 0.8 A/mm$^2$, desired characteristics can be obtained irrespective of the shape or layout of the p-side electrode. The shape and layout of the p-side electrode and the n-side electrode are not limited to the configuration of the present embodiment where two electrodes, the rectangular n-side electrode and the square p-side electrode, are arranged side by side. However, various types of configurations may be possible and, for example, one possible configuration is such that one or a plurality of n-side electrodes are partially or entirely surrounded by a p-side electrode. In that case, the dependence of Ja on the area of the p-side electrode is equivalent, and Ja does not depend on the shape or layout of the electrodes.

Figure 8:
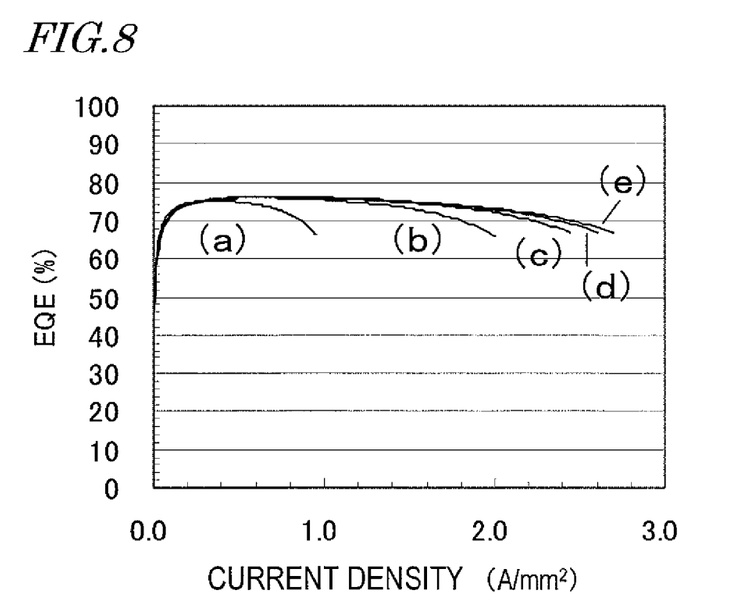
FIG. 8 is a graph showing the n-type GaN-based semiconductor region thickness dependence of the external quantum efficiency.

FIG. 8 shows the simulation results of the relationship between the current density dependence of the external quantum efficiency (EQE) of the m-plane nitride-based semiconductor light-emitting device and the thickness of the n-type GaN-based semiconductor region. The horizontal axis represents the driving current of the chip, and the vertical axis represents the external quantum efficiency. Curves (a), (b), (c), (d), and (e) of FIG. 8 represent the results for the cases where the thickness of the n-type GaN substrate was 5 µm, 25 µm, 50 µm, 75 µm, and 100 µm, respectively. In the examples of the curves (a), (b), (c), (d), and (e), the ratio of the thickness of the active layer to the thickness of the n-type GaN-based semiconductor region is $5.63\times10^{-3}$, $1.61\times10^{-3}$, $8.49\times10^{-4}$, $5.77\times10^{-4}$, and $4.37\times10^{-4}$, respectively.

In the simulation of FIG. 8, the area of the p-side electrode 30 was 90000 µm$^2$ (a square of 300 µm on each side). With such a small area p-side electrode 30, non-radiative centers which are attributed to oxygen can be filled by high current injection, and light emission of high efficiency can be realized even with a low electric current. The total thickness of the p-type Al$_d$Ga$_e$N layer 25 and the p-Al$_d$Ga$_e$N contact layer 26 was 100 nm. The active layer was formed by a multi-quantum well including three cycles of InGaN well layers of 15 nm and GaN barrier layers of 30 nm. The total thickness of the active layer was 45 nm. The thickness of the n-type GaN-based semiconductor region was 3 μm. The n-type carrier concentration of the substrate was $1\times10^{18}$ cm$^{-3}$. The simulation was carried out with the thickness of the substrate being varied, and the results represented by the curves (a), (b), (c), (d), and (e) of FIG. 8 were obtained.

The n-type GaN-based semiconductor region also includes a substrate which is made of a n-type semiconductor. Specifically, in the examples of the curves (a), (b), (c), (d), and (e), the thickness of the n-type GaN-based semiconductor region is 8 μm, 28 μm, 53 μm, 78 μm, and 103 μm, respectively. When the area of the p-side electrode is small as in the present embodiment, the external quantum efficiency in the low current range can be maintained at a high value. On the other hand, there is a tendency that the external quantum efficiency decreases in the large current range. Further, when the thickness of the n-type GaN-based semiconductor region is small, the maximum value of the external quantum efficiency in the low current range is equivalent to that which is obtained when the thickness of the n-type GaN-based semiconductor region is large, but the decrease of the efficiency becomes larger as the electric current increases. However, when the thickness of the n-type GaN-based semiconductor region increases, the electric current value at which the external quantum efficiency starts to decrease becomes higher, so that the decrease of the efficiency can be prevented. When the thickness of the n-type GaN substrate was not less than 50 μm, i.e., when the thickness of the n-type GaN-based semiconductor region was not less than 53 μm, the variation of the external quantum efficiency-current value characteristic became smaller. Further, when the thickness of the n-type GaN substrate was not less than 100 μm, i.e., when the thickness of the n-type GaN-based semiconductor region was not less than 103 μm, the variation of the external quantum efficiency-current value characteristic became still smaller.

When the area of the p-side electrode is small as in the embodiment of the present invention, the external quantum efficiency in the low current range can be maintained at a high value. However, on the other hand, the external quantum efficiency in the large current range decreases. This tendency is probably attributed to the mechanism which will be described below.

Figure 3:
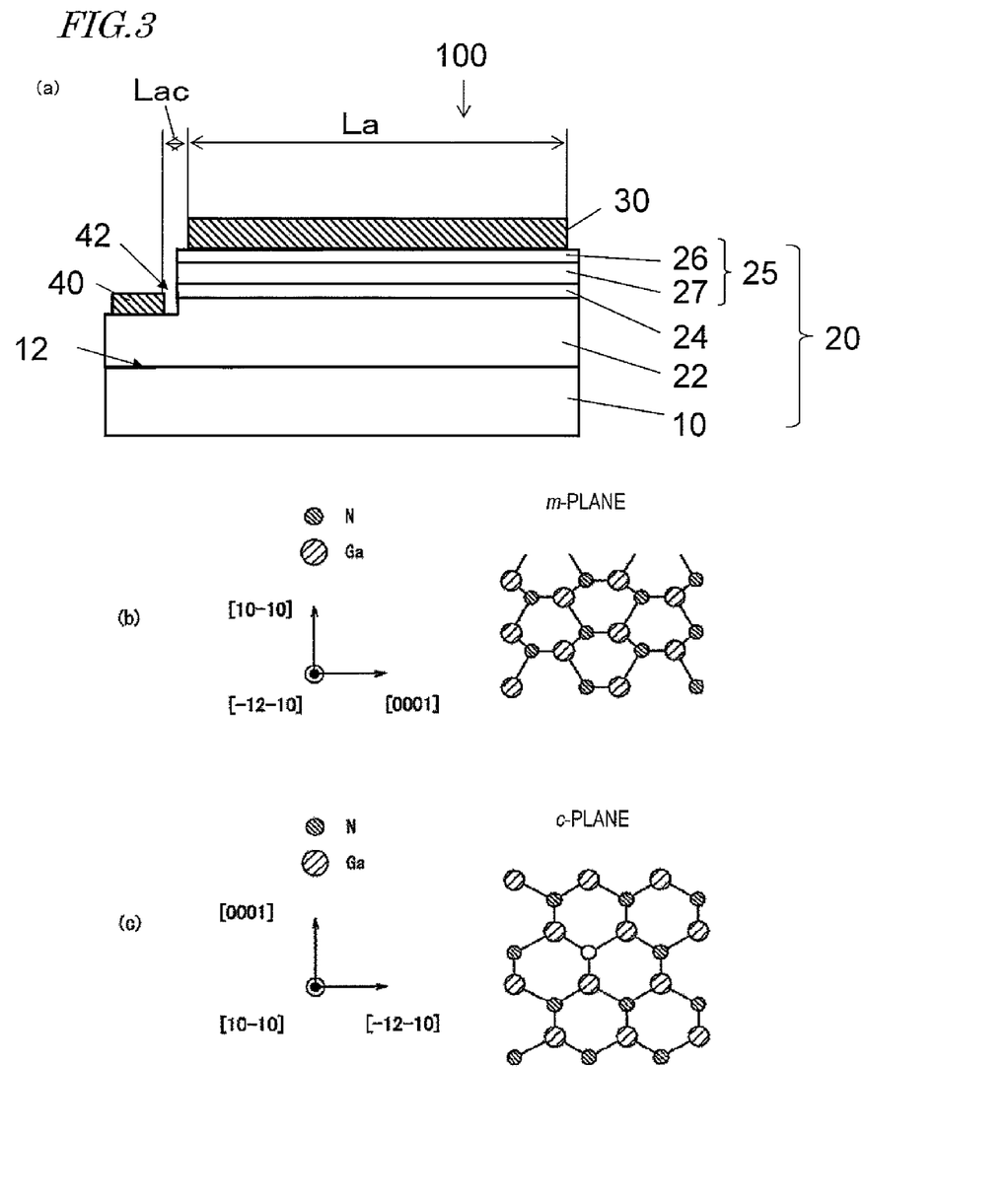
FIG. 3(a) is a schematic cross-sectional view of a nitride-based semiconductor light-emitting device 100 of the first embodiment.
FIG. 3(b) is a diagram showing the crystal structure of an m-plane.
FIG. 3(c) is a diagram showing the crystal structure of a c-plane.

In an embodiment which has the configuration shown in FIG. 3(*a*), the n-side electrode 40 and the p-side electrode 30 are positioned on the same side relative to the substrate 10, and therefore, both electrons and holes are injected from a surface of the semiconductor layer on the same side. When the semiconductor light-emitting device is driven to operate, electrons injected from the n-side electrode 40 into the n-type semiconductor layer (the Al$_u$Ga$_v$In$_w$N layer 22 and the substrate 10) horizontally flow through the n-type semiconductor layer and are then injected into the active layer 24 that resides below the p-side electrode 30. If the thickness of the n-type semiconductor layer is small, the cross-sectional area is small for the horizontal flow through this n-type semiconductor layer, and the electric resistance increases. Therefore, a large voltage drop occurs in the n-type semiconductor layer, and the effective voltage that is applied to the active layer 24 decreases. As a result, the amount of electrons injected into the active layer 24 decreases, and the external quantum efficiency decreases. On the other hand, when the area of the p-side electrode 30 decreases, the electric resistance of the p-type semiconductor layer 25 increases. Therefore, even when the area of the p-side electrode 30 is decreased, the amount of injected carriers decreases, and the external quantum efficiency decreases. In addition, when the area of the p-side electrode 30 is decreased, the voltage that is applied to the active layer 24 is mainly applied to a region lying between the n-side electrode 40 and the p-side electrode 30, and the electric current concentrates in that region.

According to the present invention, by regulating the area of the p-side electrode 30 and the thickness of the n-type semiconductor layer so as to fall within predetermined ranges, high luminous efficiencies can be realized over a wide range of the electric current amount.

Figure 9:
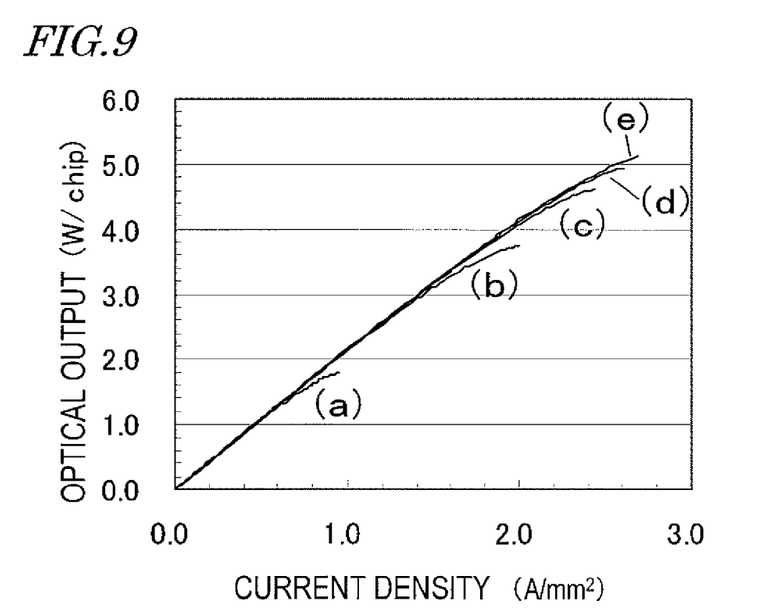
FIG. 9 is a graph showing the n-type GaN-based semiconductor region thickness dependence of the optical output.

FIG. 9 shows the relationship between the optical output of the m-plane nitride-based semiconductor light-emitting device and the thickness of the n-type GaN substrate. This relationship was obtained by simulation. The area of the p-side electrode was 90000 μm$^2$ (a square of 300 μm on each side). The total thickness of the active layer was 45 nm. The curves (a), (b), (c), (d), and (e) represent the results for the cases where the thickness of the n-type GaN substrate was 5 μm, 25 μm, 50 μm, 75 μm, and 100 μm, respectively, as in FIG. 8.

It can be seen that, by adding the thickness of the n-type GaN-based substrate in consideration of the above-described tendency of the external quantum efficiency, the linearity of the optical output is improved, and a high output can be obtained. When the thickness of the n-type GaN-based substrate was not less than 50 μm, the variation of the optical output-current value characteristic was very small.

Although the thickness of the active layer was 45 nm in this simulation, the examination was also carried out under the conditions that the thickness of the n-type GaN substrate was 100 μm and the thickness of the active layer was 27 nm (D=2.62×10$^{-4}$). As a result, it was discovered that the lower limit of D at which the same effects are achieved is 27 nm (D=2.62×10$^{-4}$).

As seen from the above results, the problems that are specific to the m-plane nitride-based semiconductor light-emitting device can be solved when the ratio of the thickness of the active layer to the thickness of the n-type GaN-based semiconductor region, D, is in the range of $2.62\times10^{-4}\leq D\leq 8.49\times10^{-4}$ and the area of the p-side electrode, S, is in the range of 100 μm$^2\leq$S$\leq$90000 μm$^2$. Further, when D is in the range of $4.37\times10^{-4}\leq D\leq 5.77\times10^{-4}$, a high luminous efficiency can be achieved. When S is in the range of 2500 μm$^2\leq$S$\leq$90000 μm$^2$, a sill higher luminous efficiency can be achieved.

Figure 10:
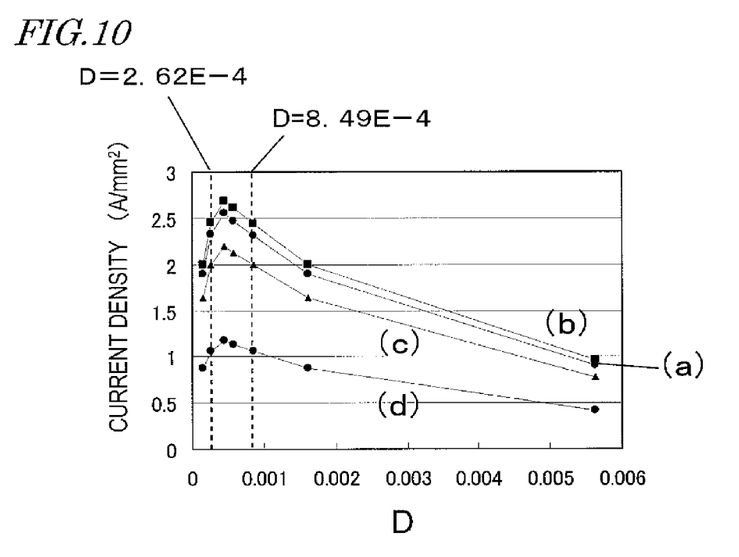
FIG. 10 is a graph showing the dependence of the droop of the external quantum efficiency on the ratio of the active layer thickness to the n-type semiconductor layer thickness, D.

FIG. 10 is a graph showing the dependence of the droop of the external quantum efficiency on the ratio of the thickness of the active layer to the thickness of the n-type GaN-based semiconductor region, D. As seen from FIG. 8, as the driving current density of the LED is increased, the external quantum efficiency decreases. FIG. 10 shows the maximum current density at which 88% or more of the maximum external quantum efficiency was achieved, which was plotted with D being varied. Specifically, for each value of D, the current density was gradually increased, and values of the current density at which the external quantum efficiency decreased to 88% due to the droop of the LED were plotted. It is shown that, on the curves of FIG. 10, as the current density increases, decrease of the external quantum efficiency, i.e., occurrence of a droop, is prevented even at high current densities. This result was obtained by simulation.

When a value of the maximum current density which leads to 88% of the maximum external quantum efficiency is not less than 2 A/mm$^2$, desired characteristics can be obtained. When D is in the range of $1.8\times10^{-4}\leq D\leq 14.1\times10^{-4}$, this maximum current density value is not less than 2 A/mm$^2$.

The lines (a), (b), (c), and (d) of FIG. 10 represent the dependence for the cases where the area of the p-side electrode was 100 µm², 90000 µm², 160000 µm², and 360000 µm², respectively. It can be seen that, in a range where the area of the p-side electrode is not less than 100 µm² and not more than 90000 µm², the decrease of the external quantum efficiency is small even at high current densities. In other words, the droop is small even at high current densities. It was also confirmed that, within the range of the area of the p-side electrode which is not less than 100 µm² and not more than 90000 µm², when D is in the range of $2.62 \times 10^{-4} \leq D \leq 8.49 \times 10^{-4}$, the decrease of the external quantum efficiency is small even at high current densities.

Figure 11:
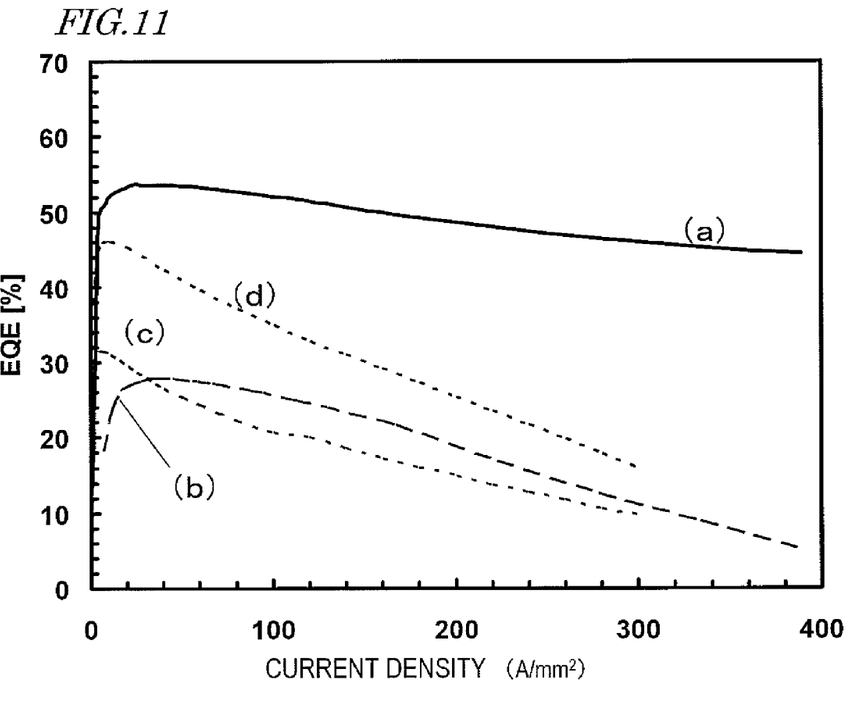
FIG. 11 is a graph showing the external quantum efficiency in various c-plane and m-plane nitride-based semiconductor light-emitting devices.

The m-plane nitride-based semiconductor light-emitting device of the present embodiment was experimentally verified. FIG. 11 shows the comparison of the external quantum efficiency in various types of c-plane and m-plane nitride-based semiconductor light-emitting devices. In FIG. 11, the curve (a) represents the external quantum efficiency for the case of an m-plane nitride-based semiconductor light-emitting device of the present embodiment of which LED size was a square of 0.3 mm on each side (the area of the p-side electrode was 81000 µm²) and which included an active layer having a total thickness of 0.045 µm and a 103 µm thick n-type GaN-based semiconductor region ($D=4.37 \times 10^{-4}$). The curve (b) represents the external quantum efficiency for the case of an m-plane nitride-based semiconductor light-emitting device of a comparative example of which LED size was a square of 0.3 mm on each side (the area of the p-side electrode was 81000 µm²) and which included a 0.06 µm thick active layer and a 53 µm thick n-type GaN-based semiconductor region ($D=1.13 \times 10^{-3}$). The curve (c) represents the external quantum efficiency for the case of a c-plane nitride-based semiconductor light-emitting device of another comparative example of which LED size was a square of 0.3 mm on each side (the area of the p-side electrode was 81000 µm²) and which included a 0.06 µm thick active layer, a 8 µm thick n-type GaN-based semiconductor region ($D=7.5 \times 10^{-3}$), and a sapphire substrate. The curve (d) represents the external quantum efficiency for the case of a c-plane nitride-based semiconductor light-emitting device of still another comparative example of which LED size was a square of 1 mm on each side (the area of the p-side electrode was 900000 µm²) and which included a 0.06 µm thick active layer, a 8 µm thick n-type GaN-based semiconductor region ($D=7.5 \times 10^{-3}$).

It was confirmed that the m-plane nitride-based semiconductor light-emitting device of the present embodiment exhibited high efficiencies in both the low current range and the high current range. Thus, high external quantum efficiencies were realized over the entire electric current range.

On the other hand, in the case of the comparative example m-plane nitride-based semiconductor light-emitting device for the curve (b) of FIG. 11, the efficiency was low particularly at low current densities. In the case of the comparative example c-plane nitride-based semiconductor light-emitting devices for the curves (c) and (d), the efficiency was low at high current densities.

Figure 12:
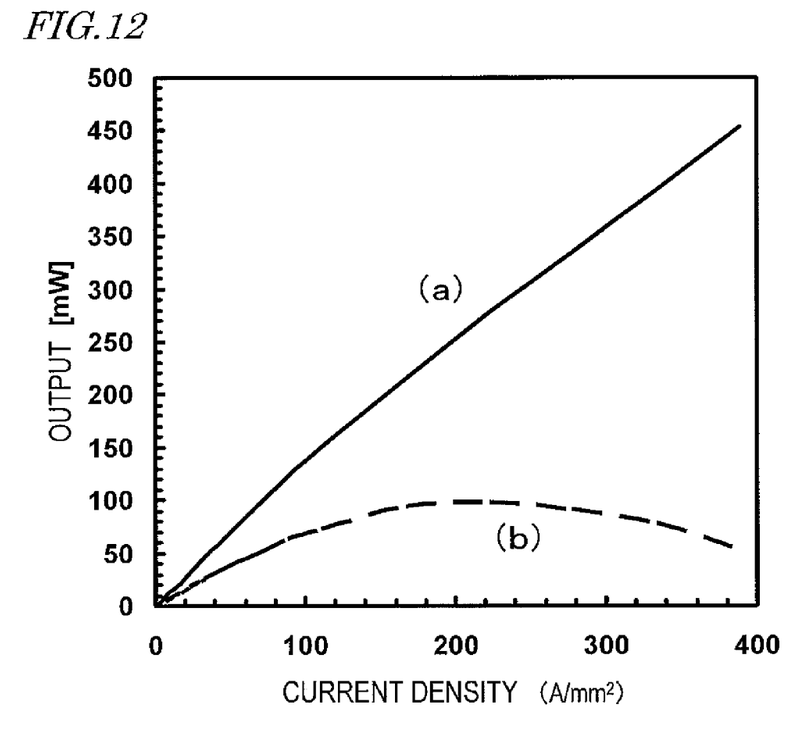
FIG. 12 is a graph showing the optical output in a conventional m-plane nitride-based semiconductor light-emitting device and an m-plane nitride-based semiconductor light-emitting device of the present embodiment.

FIG. 12 shows the comparison between the output of the m-plane nitride-based semiconductor light-emitting device of the comparative example and the output of the m-plane nitride-based semiconductor light-emitting device of the present embodiment. In FIG. 12, the curve (a) represents the output of an m-plane nitride-based semiconductor light-emitting device of which LED size was a square of 0.3 mm on each side (the area of the p-side electrode was 81000 µm²) and which included a 0.045 µm thick active layer and a 103 µm thick n-type GaN-based semiconductor region ($D=4.37 \times 10^{-4}$). The curve (b) represents the output of an m-plane nitride-based semiconductor light-emitting device of a comparative example of which LED size was a square of 0.3 mm on each side (the area of the p-side electrode was 81000 µm²) and which included a 0.06 µm thick active layer and a 53 µm thick n-type GaN-based semiconductor region ($D=1.13 \times 10^{-3}$). Since the results shown in FIG. 11 were reflected herein, the device of the present embodiment exhibited excellent linearity, and achieved high optical outputs, even at high current densities.

Next, a method for manufacturing the nitride-based semiconductor light-emitting device 100 according to the present embodiment is described with again reference to FIG. 3(a).

First, an m-plane substrate 10 is prepared. In this embodiment, a GaN substrate is used as the substrate 10. The GaN substrate of this embodiment is obtained by HVPE (Hydride Vapor Phase Epitaxy).

For example, firstly, a thick GaN film on the order of 5 mm to 20 mm is grown on a c-plane sapphire substrate. Thereafter, the thick GaN film is diced perpendicularly to the c-plane, i.e., parallel to the m-plane, thereby obtaining m-plane GaN substrates. However, the GaN substrate does not have to be prepared by this particular method. Alternatively, an ingot of bulk GaN may be made by a liquid phase growth process such as a Na flux method or a melt-growth method such as an ammonothermal process and then diced parallel to the m-plane.

The substrate 10 used may be a GaN substrate or may alternatively be a different type of substrate, such as a gallium oxide substrate, a SiC substrate, a Si substrate, a sapphire substrate. To grow an m-plane GaN-based semiconductor on the substrate by epitaxy, the plane orientation of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the growing plane of the semiconductor multilayer structure 20 should be an m-plane. In this embodiment, crystal layers are formed one after another on the substrate 10 by MOCVD (Metal Organic Chemical Vapor Deposition) process.

Specifically, an n-type $Al_uGa_vIn_wN$ layer 22 is formed on the m-plane GaN substrate 10. As the $Al_uGa_vIn_wN$ layer 22, GaN may be deposited to a thickness of 3 µm, for example. A GaN layer may be deposited by supplying TMG ($Ga(CH_3)_3$), TMA ($Al(CH_3)_3$) and $NH_3$ gases onto the m-plane GaN substrate 10 at 1100° C., for example.

Then, an active layer 24 is formed on the n-type $Al_uGa_vIn_wN$ layer 22. In the present embodiment, the active layer 24 is formed such that the ratio of the thickness of the active layer 24 to the final thickness of the n-type semiconductor layer (the total thickness of the GaN substrate and the $Al_uGa_vIn_wN$ layer 22), D, is in the range of $1.8 \times 10^{-4} \leq D \leq 14.1 \times 10^{-4}$. Further, it may be in the range of $2.62 \times 10^{-4} \leq D \leq 8.49 \times 10^{-4}$. In this example, the active layer 24 has a GaInN/GaN multi-quantum well (MQW) structure in which three cycles of $Ga_{0.9}In_{0.1}N$ well layers having a thickness of 15 nm and GaN barrier layers having a thickness of 30 nm have been stacked alternately. When the $Ga_{0.9}In_{0.1}N$ well layers are formed, the growth temperature may be lowered to 800° C. in order to introduce In.

Thereafter, an undoped GaN layer is deposited to a thickness of 30 nm, for example, on the active layer 24, and then an $Al_dGa_eN$ layer 25 is formed on the undoped GaN layer. When the $Al_dGa_eN$ layer 25 is a 0.05 µm thick p-$Al_{0.14}Ga_{0.86}N$ layer, for example, TMG, NH$_3$, TMA, and Cp$_2$Mg (cyclopentadienyl magnesium) as a p-type impurity are supplied at the growth temperature of 950° C.

Then, in the upper part of the p-Al$_d$Ga$_e$N layer 25, a p-Al$_d$Ga$_e$N contact layer 26 of 50 nm thick, for example, is formed. Here, the supply of Cp$_2$Mg is increased such that the Mg concentration of the p-Al$_d$Ga$_e$N contact layer 26 is higher than the Mg concentration of the remaining part of the Al$_d$Ga$_e$N layer 25.

As the p-Al$_d$Ga$_e$N contact layer 26, a 50 nm thick GaN layer having the Mg concentration of $4\times10^{19}$ cm$^{-3}$ may be formed. In this case, formation of the GaN layer may be realized by supplying, for example, TMG at a flow rate of 8 sccm, NH$_3$ at a flow rate of 7.5 slm, and Cp$_2$Mg at a flow rate of 400 sccm, while the growth temperature is maintained at 950° C. For example, if the ratio of the flow rate of the source gas of Mg to the total flow rate of the source gases (source gases for crystal and impurity) is not less than 5%, the impurity concentration of the p-Al$_d$Ga$_e$N contact layer 26 can be not less than $4\times10^{19}$ cm$^{-3}$.

The growth temperature of the p-Al$_d$Ga$_e$N contact layer 26 may be not less than 900° C. and not more than 1000° C. If the growth temperature is lower than 900° C., there is a problem that the crystallinity deteriorates due to the decrease of the growth rate. If the growth temperature is higher than 1000° C., omission of nitrogen causes surface roughness.

Thereafter, respective portions of the p-GaN contact layer, the Al$_d$Ga$_e$N layer 25, the undoped GaN layer, and the active layer 24 are removed by performing a chlorine-based dry etching process, thereby making a recess 42 and exposing a region of the Al$_u$Ga$_v$In$_w$N layer 22 where an n-side electrode will be formed. Then, Ti/Pt layers are formed as an n-side electrode 40 on the region reserved for a n-side electrode at the bottom of the recess 42.

Subsequently, an Ag layer is formed on the p-Al$_d$Ga$_e$N contact layer 26 to form a p-side electrode 30. Thereafter, a heat treatment is carried out at 600° C. for 10 minutes. Here, the area of the p-side electrode 30 is in the range of $1\times10^2$ μm$^2 \leq S \leq 9\times10^4$ μm$^2$ or $2.5\times10$ m$^2 \leq S$.

Optionally, the substrate 10 and a portion of the Al$_u$Ga$_v$In$_w$N layer 22 may be removed after that by some technique such as laser lift-off, etching or polishing. In that case, only the substrate 10 may be removed. Alternatively, the substrate 10 and a portion of the Al$_u$Ga$_v$In$_w$N layer 22 may be removed selectively. It is naturally possible to leave the substrate 10 and the Al$_u$Ga$_v$In$_w$N layer 22 as they are without removing them.

The above-described process of forming the semiconductor multilayer structure is performed on a single wafer before the substrate 10 that carries a plurality of semiconductor light-emitting devices is separated. Then, the semiconductor multilayer structure in the form of a wafer is separated into individual chips. In the present embodiment, the semiconductor multilayer structure is separated such that the area of the growing plane of the active layer 24 after the separation, S, is in the range of $1\times10^2$ μm$^2 \leq S \leq 9.9\times10^4$ μm$^2$. When S is in the range of $S \leq 2.8\times10$ m$^2$, the separation is easily realized.

Through the above-described process, the nitride-based semiconductor light-emitting device 100 of the present embodiment is manufactured.

In the nitride-based semiconductor light-emitting device 100 of this embodiment, when a voltage is applied between the n-side electrode 40 and the p-side electrode 30, holes are injected from the p-side electrode 30 into the active layer 24 and electrons are injected from the n-side electrode 40 into the active layer 24, thus producing photoluminescence with a wavelength of about 450 nm.

Other Embodiments

The above-described light-emitting device of an embodiment of the present invention may be used as it is as a light source. However, if the light-emitting device of the present embodiment is combined with a resin including a phosphoric material that produces wavelength conversion, for example, the device of the present invention can be used effectively as a light source having an expanded operating wavelength range (such as a white light source).

Figure 13:
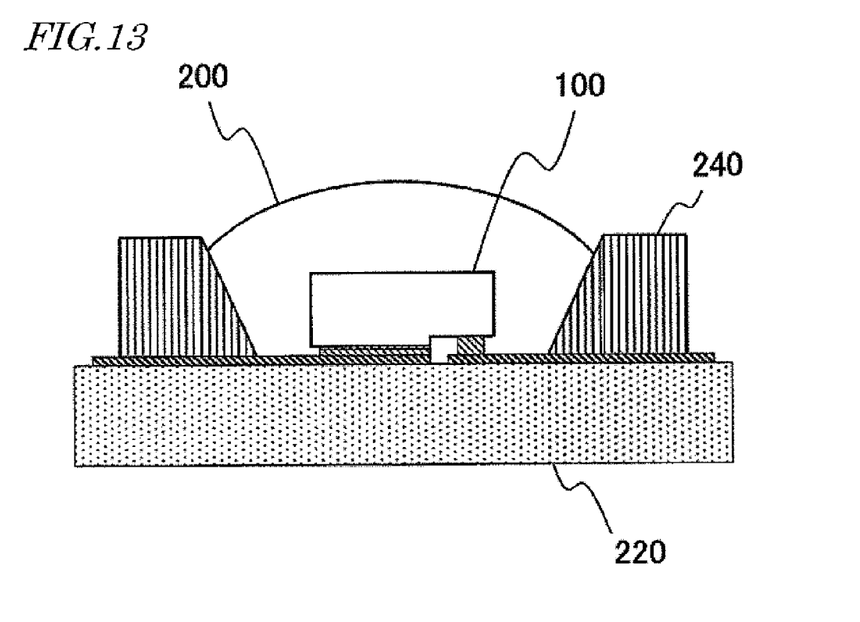
FIG. 13 is a cross-sectional view showing an embodiment of a white light source.

FIG. 13 is a schematic representation illustrating an example of such a white light source. The light source shown in FIG. 13 includes a light-emitting device 100 having the structure shown in FIG. 3(a) and a resin layer 200 in which particles of a phosphor such as YAG (yttrium aluminum garnet) are dispersed to change the wavelength of the light emitted from the light-emitting device 100 into a longer one. The light-emitting device 100 has been mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

In the examples described above, the p-type semiconductor region that is in contact with the electrode 30 is supposed to be made of GaN or AlGaN. However, the p-type semiconductor region may also be a layer including In such as InGaN. In that case, the contact layer to be in contact with the electrode 30 may be made of In0.2Ga0.8N having an In composition ratio of 0.2, for example. If In is included in GaN, the bandgap of Al$_a$Ga$_b$N layer (where a+b=1, a≥0, b≥0) can be smaller than that of GaN, and therefore, the contact resistance can be reduced as a result. Consequently, the p-type semiconductor region (p-Al$_d$Ga$_e$N contact layer 26) that is in contact with the Mg layer may be made of an Al$_x$Ga$_y$In$_z$N semiconductor (where x+y+z=1, x≥0, y≥0 and z≥0).

The actual growing plane or principal surface of an m-plane semiconductor does not need to be perfectly parallel to the m-plane but may be tilted from the m-plane by a predetermined angle. The tilt angle is defined by an angle formed by the normal line to the actual growing plane of the nitride semiconductor layer and the normal line to the m-plane (m-plane without inclination). The actual growing plane can be tilted from the m-plane (m-plane without inclination) in the direction of a vector which is represented by the c-axis direction and the a-axis direction. The absolute value of the inclination angle θ may be not more than 5°, preferably not more than 1°, in the c-axis direction. In the a-axis direction, the absolute value of the tilt angle θ may be not more than 5°, preferably not more than 1°.

Specifically, in the present invention, the "m-plane" includes a plane which is tilted from the m-plane (m-plane without inclination) in a predetermined direction by an angle in the range of ±5°. Within such an tilt angle, the growing plane of the nitride semiconductor layer, as a whole, is tilted from the m-plane. However, it includes a case where, upon closer observation, a large number of m-plane regions are exposed. Thus, it is expected that a plane which is tilted from the m-plane by an angle of not more than 5° (absolute value) has the same characteristics as those of the m-plane. When the absolute value of the tilt angle θ is greater than 5°, the internal quantum efficiency decreases due to a piezoelectric field. Therefore, it is desired that the absolute value of the tilt angle θ is set to 5° or smaller.

In the first and second embodiments, the Al$_d$Ga$_e$N layer 25 and the p-Al$_d$Ga$_e$N contact layer 26 are doped with Mg as the p-type impurity. However, according to the present invention, other examples of the p-type dopant than Mg include Zn and Be.

According to the embodiments which have been described above, in a GaN-based semiconductor device which is realized by crystal growth on an m-plane substrate or a GaN-based semiconductor multilayer structure of which principal surface is an m-plane, a carrier overflow is prevented, and stable and high luminous efficiency is achieved over a wide range of current densities. In other words, linearity of the output is obtained. Therefore, positive utilization of a GaN-based semiconductor device which is realized by crystal growth on an m-plane substrate, or a GaN-based semiconductor multilayer structure of which principal surface is an m-plane, is enabled although positive utilization has been conventionally difficult because of its difficulty in achieving high efficiency in the low current range.

INDUSTRIAL APPLICABILITY

The embodiments of the present invention can be employed for a GaN-based semiconductor light-emitting device, such as a light-emitting diode or a laser diode that operates at wavelengths over the ultraviolet range and the entire visible range, which covers blue, green, orange and white parts of the spectrum, and for a manufacturing method of that device.

REFERENCE SIGNS LIST 10 substrate (GaN-based substrate)
12 substrate surface (m-plane)
20 semiconductor multilayer structure
22 $Al_uGa_vIn_wN$ layer
24 active layer
25 $Al_dGa_eN$ layer
26 p-$Al_dGa_eN$ contact layer
30 p-side electrode
40 n-side electrode
100, 101 nitride-based semiconductor light-emitting device
200 resin layer
220 supporting member
240 reflective member

The invention claimed is:

1. A nitride-based semiconductor light-emitting device, comprising a semiconductor multilayer structure having a growing plane which is an m-plane and being made of a GaN-based semiconductor, wherein
the semiconductor multilayer structure includes a n-type semiconductor layer, a p-type semiconductor layer, a p-side electrode provided on the p-type semiconductor layer, and an active layer interposed between the n-type semiconductor layer and the p-type semiconductor layer,
a ratio of a thickness of the active layer to a thickness of the n-type semiconductor layer, D, is in the range of $1.8 \times 10^{-4} \leq D \leq 14.1 \times 10^{-4}$,
an area of the p-side electrode, S, is in the range of $1 \times 10^2 \, \mu m^2 \leq S \leq 9 \times 10^4 \, \mu m^2$, and
a maximum current density which leads to 88% of a maximum of the external quantum efficiency is not less than 2 A/mm$^2$.

2. The nitride-based semiconductor light-emitting device of claim 1, wherein the ratio of the thickness of the active layer to the thickness of the n-type semiconductor layer, D, is in the range of $2.62 \times 10^{-4} \leq D \leq 8.49 \times 10^4$.

3. The nitride-based semiconductor light-emitting device of claim 1, wherein the area of the p-side electrode, S, is in the range of $1 \times 10^2 \, \mu m^2 \leq S \leq 4 \times 10^4 \, \mu m^2$.

4. The nitride-based semiconductor light-emitting device of claim 1, wherein the active layer has an oxygen concentration of not less than $2 \times 10^{17}$ cm$^{-3}$.

5. The nitride-based semiconductor light-emitting device of claim 1, wherein the thickness of the active layer is not less than 0.027 μm and not more than 0.045 μm.

6. The nitride-based semiconductor light-emitting device of claim 1, wherein the n-type semiconductor layer includes a substrate which is made of a n-type semiconductor.

7. The nitride-based semiconductor light-emitting device of claim 1, wherein the semiconductor multilayer structure is made of an $Al_xGa_yIn_zN$ ($x+y+z=1$, $x \geq 0$, $y \geq 0$, $z \geq 0$) semiconductor.

8. A light source, comprising:
the nitride-based semiconductor light-emitting device as set forth in claim 1; and
a wavelength converting section including a phosphor that converts a wavelength of light emitted from the nitride-based semiconductor light-emitting device.

9. A method for manufacturing a nitride-based semiconductor light-emitting device, comprising the steps of:
(a) forming a semiconductor multilayer structure having a growing plane which is an m-plane and being made of a GaN-based semiconductor; and
(b) forming a p-side electrode on the semiconductor multilayer structure, wherein the step (a) includes
(a1)) forming a n-type semiconductor layer,
(a2) after the step (a1), an active layer formation step for forming an active layer, and
(a3) after the step (a2), forming a p-type semiconductor layer,
in the step (a1)) and the step (a2), the n-type semiconductor layer and the active layer are formed such that a maximum current density which leads to 88% of a maximum of the external quantum efficiency is not less than 2 A/mm$^2$,
in the step (a2), the active layer is formed such that a ratio of a thickness of the active layer to a final thickness of the n-type semiconductor layer, D, is in the range of $1.8 \times 10^{-4} \leq D \leq 14.1 \times 10^{-4}$, and
in the step (b), the p-side electrode is formed such that an area of the p-side electrode, S, is in the range of $1 \times 10^2 \, \mu m^2 \leq S \leq 9 \times 10^4 \, \mu m^2$.

10. The method of claim 9, wherein in the step (a2), the active layer is formed such that the ratio of the thickness of the active layer to the final thickness of the n-type semiconductor layer, D, is in the range of $2.62 \times 10^{-4} \leq S \leq 8.49 \times 10^{-4}$.

11. The method of claim 9, wherein in the step (b), the p-side electrode is formed such that the area of the p-side electrode, S, is in the range of $1 \times 10^2 \, \mu m^2 \leq S \leq 4 \times 10^4 \, \mu m^2$.

12. The method of claim 9, wherein the active layer has an oxygen concentration of not less than $2 \times 10^{17}$ cm$^{-3}$.

13. The method of claim 9, wherein the thickness of the active layer is not less than 0.027 μm and not more than 0.045 μm.

14. The method of claim 9, wherein the n-type semiconductor layer includes a substrate which is made of a n-type semiconductor.

15. The method of claim 9, wherein the semiconductor multilayer structure is made of an $Al_xGa_yIn_zN$ ($x+y+z=1$, $x \geq 0$, $y \geq 0$, $z \geq 0$) semiconductor.

* * * * *